United States Patent
Nakajima et al.

(10) Patent No.: US 6,992,876 B1
(45) Date of Patent: Jan. 31, 2006

(54) ELECTROSTATIC CHUCK AND ITS MANUFACTURING METHOD

(75) Inventors: Shu Nakajima, Chigasaki (JP); Yasushi Tanaka, Mitaka (JP)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 10/030,592

(22) PCT Filed: Jul. 8, 1999

(86) PCT No.: PCT/JP99/03701

§ 371 (c)(1),
(2), (4) Date: May 21, 2002

(87) PCT Pub. No.: WO01/04945

PCT Pub. Date: Jan. 18, 2001

(51) Int. Cl.
*H01G 23/00* (2006.01)
(52) U.S. Cl. .................... 361/234; 361/230; 361/233; 269/8; 269/903; 279/128; 118/724
(58) Field of Classification Search ............... 361/234, 361/230, 233; 269/8, 903; 279/128; 118/724
See application file for complete search history.

(56) References Cited

U.S. PATENT DOCUMENTS

| | | | | |
|---|---|---|---|---|
| 5,055,964 A * | 10/1991 | Logan et al. | ............... | 361/234 |
| 5,191,506 A * | 3/1993 | Logan et al. | ............... | 361/234 |
| 5,400,209 A * | 3/1995 | Moslehi | ............... | 361/234 |
| 5,777,838 A * | 7/1998 | Tamagawa et al. | ......... | 361/234 |
| 5,788,814 A * | 8/1998 | Sun et al. | ................... | 279/128 |
| 5,810,933 A * | 9/1998 | Mountsier et al. | .......... | 118/724 |

FOREIGN PATENT DOCUMENTS

EP  0 805 487   5/1997
EP     0805487 A2 * 11/1997 ................. 361/234

* cited by examiner

*Primary Examiner*—Dean A. Reichard
*Assistant Examiner*—Anton Harris
(74) *Attorney, Agent, or Firm*—Martine Penilla & Gencarella, LLP (57) ABSTRACT

An electrostatic chuck for preventing warpage of a ceramic layer and cooling gas leakage while providing enhanced electrostatic attraction and an improved detachment performance and its manufacturing method is disclosed. The chuck comprises at least one electrode (90, 91, 92) located in the middle of the ceramic layer (80) in its thickness direction, a cooling gas channel (81) is formed on a surface of the ceramic layer within an outer edge of the electrode and above the electrode, wherein the electrode extends beyond the cooling gas channel. Preferably the electrodes are shaped in the form of two interlocked structures comprising multiple interconnected C-shaped ring portion (91c, 92c).

13 Claims, 6 Drawing Sheets

(PRIOR ART)

Fig. 5

(PRIOR ART)

Fig. 6

(PRIOR ART)

Fig. 7

(PRIOR ART)

Fig. 8

(PRIOR ART)

Fig. 9

(PRIOR ART)

ELECTROSTATIC CHUCK AND ITS MANUFACTURING METHOD

BACKGROUND OF THE INVENTION

1. Field of the Invention

The present invention relates to an electrostatic chuck, and associated manufacturing process, for use in an etching apparatus for manufacturing semiconductors.

2. Description of the Related Art

Figure 4:
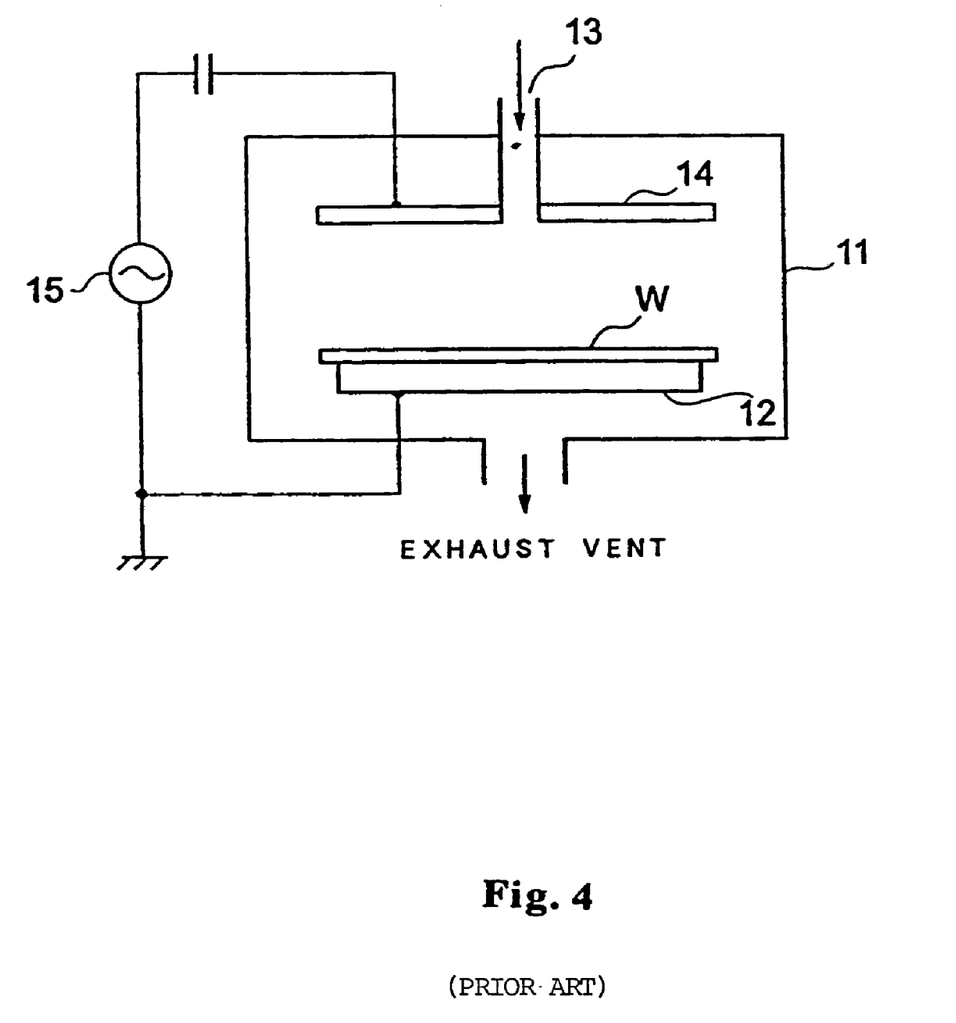
FIG. 4 is a schematic view illustrating a dry etching apparatus, in accordance with the prior art.

In a semiconductor manufacturing process, etching processes are repeatedly performed together with insulating film formation, diffusion processes, and photolithographic processes. There are two types of etching processes: wet etching and dry etching. The dry etching process is implemented using a plasma etching apparatus as shown in FIG. 4. For example, with a semiconductor wafer W held on a chuck 12 in a processing chamber 11 of the etching apparatus, a reactive gas is introduced from an inlet 13 into the processing chamber 11 while high-frequency electric power 15 is applied between the chuck 12, which serves as a lower electrode, and an upper electrode 14 to generate a plasma in the processing chamber 11. Chemical reactions with radicals in the plasma and accelerated ions cause the semiconductor wafer W to be etched. More particularly, either the semiconductor wafer W itself or an insulating film (not shown) thereon is etched.

As mentioned above, during the dry etching process, the semiconductor wafer W is held on the chuck 12. In recent etching apparatuses, the chuck 12 has been specified to be an electrostatic chuck. Electrostatic chucks have demonstrated excellent characteristics in vacuum plasma processors.

The electrostatic chuck generates electrostatic forces for attracting material to the chuck. The electrostatic forces include two types: a Coulomb force and a Johnsen-Rahbek force.

Figure 5:
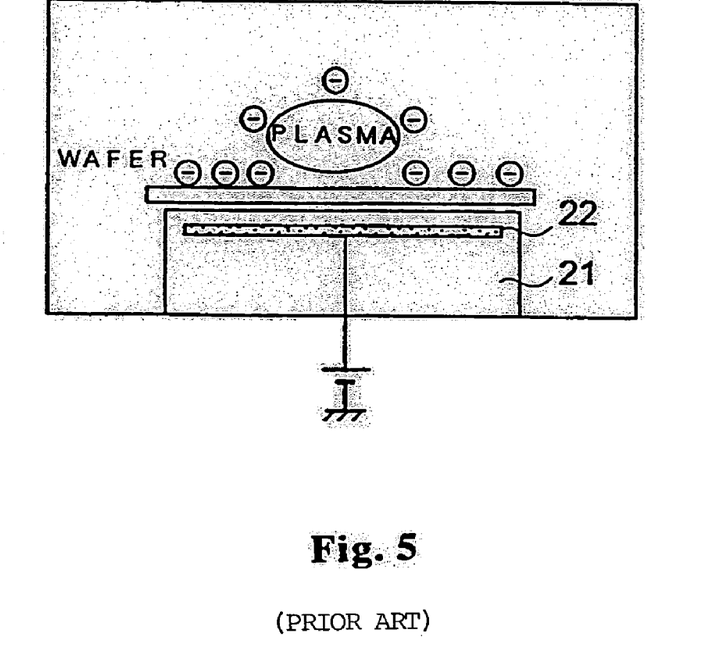
FIG. 5 is a schematic view illustrating a unipolar-type electrostatic chuck, in accordance with the prior art.
Figure 6:
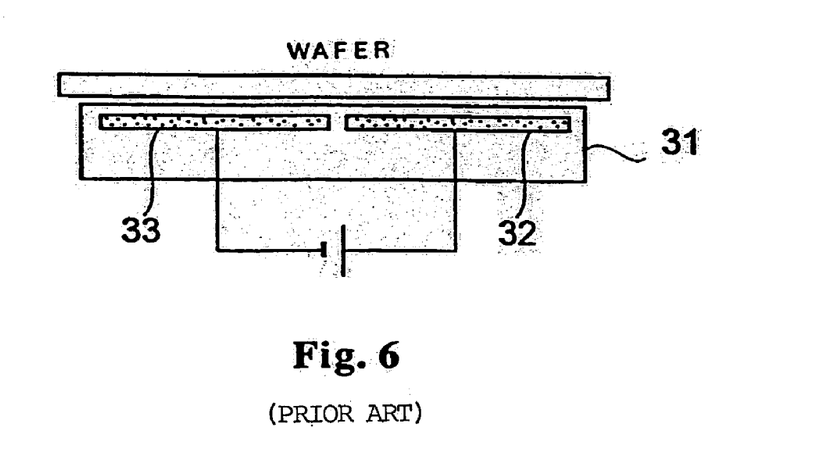
FIG. 6 is a schematic view illustrating a bipolar-type electrostatic chuck, in accordance with the prior art.

Additionally, there are two types of electrostatic chucks: a unipolar type and a bipolar type. With respect to FIG. 5, the unipolar type of electrostatic chuck includes an anode 22 formed in a dielectric material 21. Also in the unipolar type, a cathode is defined by the apparatus such that a plasma electric potential is produced as shown in FIG. 5. With respect to FIG. 6, the bipolar type of electrostatic chuck includes both an anode 32 and a cathode 33 formed in a dielectric material 31.

Figure 7:
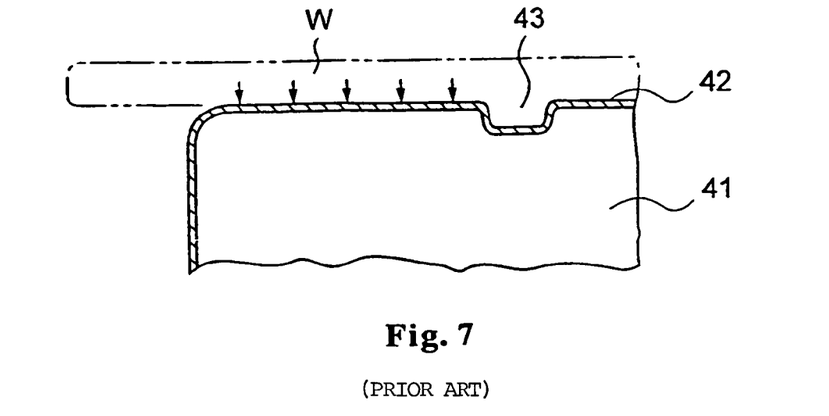
FIG. 7 is a cross-sectional view illustrating a conventional first electrostatic chuck, in accordance with the prior art.

FIG. 7 is an illustration showing a cross-sectional view of a conventional electrostatic chuck, in accordance with the prior art. The conventional electrostatic chuck includes an anodized aluminum film 42 disposed as a dielectric material on a surface of a disc-shaped aluminum electrode 41. The anodized aluminum film 42 has a thickness within a range extending from 50 μm to 60 μm. The semiconductor wafer W is placed on the anodized aluminum film 42. A cooling gas channel 43 is formed on the surface of the aluminum electrode 41 that is covered by the anodized aluminum film 42. The cooling gas channel 43 extends in a circumferential direction following a periphery of the aluminum electrode 41. A helium cooling gas is fed from gas feed orifices (not shown), penetrating the anodized aluminum film 42 and the aluminum electrode 41, to the cooling gas channel 43. The helium cooling gas flows into the cooling gas channel 43, fills the cooling gas channel 43, and then diffuses along the entire interface between the anodized aluminum film 42 and the semiconductor wafer W. The helium cooling gas diffusion occurs through fine gaps present along the interface between the anodized aluminum film 42 and the semiconductor wafer W. The fine gaps are defined by a rough surface of the anodized aluminum film 42. The helium gas diffusion serves to cool the semiconductor wafer W. In the dry etching process performed using the apparatus of FIG. 4, a temperature of the semiconductor wafer W can significantly affect the resulting etching characteristics. Use of the helium cooling gas as previously described serves to cool the semiconductor wafer W by as much as 30° C. to 60° C., thus improving the resulting etching characteristics, especially a uniformity characteristic.

The conventional electrostatic chuck as described above can be adversely affected through reaction product deposition. More specifically, reaction products present in the chamber 11 can adhere to a surface of the anodized aluminum film 42 after the semiconductor wafer W is removed from the chuck following the etching process, thus weakening the electrostatic attraction capability of the chuck in subsequent etching processes. Additionally, reaction products adhering to the surface of the anodized aluminum film 42 can increase gaps between the anodized aluminum film 42 and the semiconductor wafer W, causing leakage of the helium cooling gas from an outer peripheral edge of the aluminum electrode 41. Consequently, leakage of the helium cooling gas can cause the semiconductor wafer W to be insufficiently cooled, thus causing the etching characteristics to be adversely affected. Furthermore, during the etching process, the anodized aluminum film 42 can be deteriorated by reactive gases or ions which pass through end portions of the semiconductor wafer W, thus further weakening the electrostatic attraction capability of the chuck.

Figure 8:
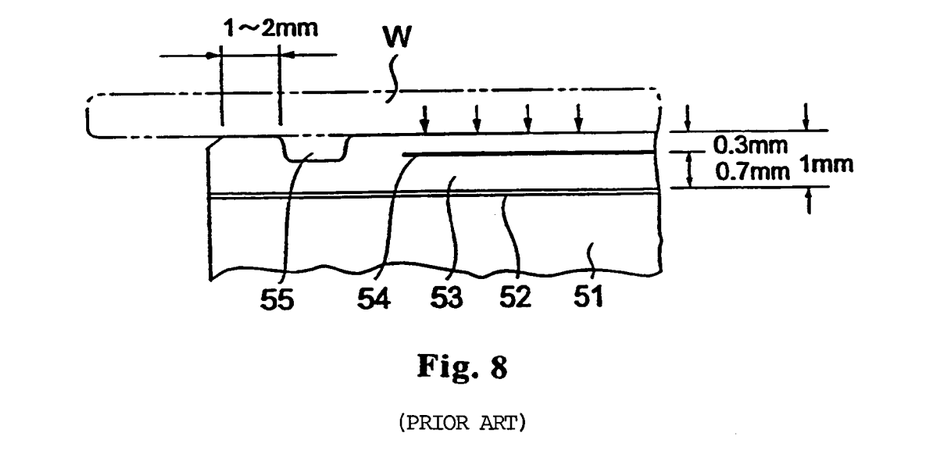
FIG. 8 is a cross-sectional view illustrating a conventional second electrostatic chuck, in accordance with the prior art.

In response to the aforementioned problems, an electrostatic chuck has been developed that incorporates a ceramic layer as the dielectric material. FIG. 8 is an illustration showing an electrostatic chuck incorporating a ceramic dielectric layer, in accordance with the prior art. This electrostatic chuck of FIG. 8 has a ceramic layer 53 bonded onto a disc-shaped metal base plate 51 by means of an adhesive layer 52. A high-melting point electrode 54 is laid in the ceramic layer 53. In this arrangement, from the viewpoint of increasing electrostatic attraction, the electrode 54 is positioned near to the surface of the ceramic layer 53. In one example, the ceramic layer 53 is 1 mm thick and the electrode 54 is positioned 0.3 mm away from a top surface of the ceramic layer 53 and 0.7 mm away from a bottom surface of the ceramic layer 53. As with the electrostatic chuck of FIG. 7, the electrostatic chuck of FIG. 8 also includes a cooling gas channel 55 formed in the top surface of the ceramic layer 53 and extending in a circumferential direction following a periphery of the ceramic layer 53. The cooling gas channel 55 needs to have a certain depth considering a flow of the helium cooling gas. Therefore, if the cooling gas channel 55 is formed at a location overlying the electrode 54, the close proximity of the electrode 54 to the top surface of the ceramic layer 53 causes a distance between the bottom of the channel 55 and the electrode 54 to become short. If the distance between the bottom of the channel 55 and the electrode 54 becomes too short, the ceramic layer 53 spanning the short distance can have an insufficient dielectric strength. To avoid the insufficient dielectric strength issue, the electrostatic chuck of FIG. 8 has the channel 55 formed 1 mm to 2 mm within an outer periphery of the ceramic layer 53, and the electrode 54 formed within an outer boundary defined by the channel 55.

The electrostatic chuck of FIG. 8, however, is not without problems. More specifically, since the electrode 54 has a coefficient of linear thermal expansion different from that of the ceramic layer 53, and given that the electrode 54 is located near a top surface of the ceramic layer 53, the ceramic layer 53 having been formed by firing is susceptible to warpage. In addition to the warpage problem, the electrostatic chuck of FIG. 8 can also be adversely affected by a cooling gas leakage problem. Leakage of the cooling gas from the channel 55 to the outer periphery of the ceramic layer 53 is intended to be prevented by the sealed interface between the ceramic layer 53 and the semiconductor wafer W extending between the channel 55 and the outer periphery of the ceramic layer 53. However, if the distance between the channel 55 and the outer periphery of the ceramic layer 53 (sealed distance) is short (e.g., 1 mm to 2 mm) a gas leakage can occur through the sealed distance.

Figure 9:
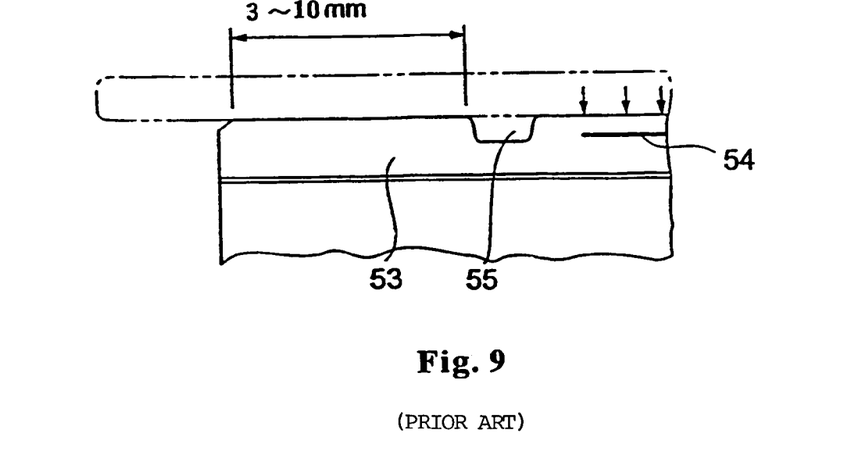
FIG. 9 is a cross-sectional view illustrating a conventional third electrostatic chuck, in accordance with the prior art.

FIG. 9 is an illustration showing the electrostatic chuck of FIG. 8 with a modification to assist in preventing gas leakage through the sealed distance, in accordance with the prior art. In the electrostatic chuck of FIG. 9, the channel 55 is formed approximately 3 mm to 10 mm inside the outer periphery of the ceramic layer 53, thus providing a substantial sealed distance. Placing the channel 55 further from the outer periphery of the ceramic layer 53, however, requires the electrode 54 to be redefined to remain within the outer boundary represented by the channel 55, thus effectively decreasing an area of the electrode 54. Decreasing the area of the electrode 54 can cause insufficient electrostatic attraction in the region between the channel 55 and the outer periphery of the ceramic layer 53.

Furthermore, there are many examples of conventional electrostatic chucks in which a semiconductor wafer attracted to the chuck cannot always be readily detached, or "dechucked," therefrom after a completion of etching or other processes. In some cases, it takes a considerable time for detachment of the semiconductor wafer.

In view of the foregoing, an apparatus is needed to overcome the problems associated with prior art electrostatic chuck arrangements. More specifically, the apparatus needs to prevent warpage of a ceramic layer and leakage of a cooling gas, while also enhancing electrostatic attraction and requiring only a short time for detachment.

SUMMARY OF THE INVENTION

The present invention provides an electrostatic chuck in which a disc-shaped ceramic layer having a predetermined thickness is bonded to a metal base plate by means of an adhesive layer. A planar electrode is located in the middle of the ceramic layer, relative to a thickness direction. A cooling gas channel is formed on a surface of the ceramic layer at a location overlying the electrode such that the electrode extends radially beyond the cooling gas channel.

Another aspect of the invention provides a method for manufacturing an electrostatic chuck. The method includes preparing a first disc-shaped ceramic material compact having a thickness which is approximately one-half of a completed ceramic layer thickness. As electrode is formed on a surface of the first ceramic material compact The method further includes preparing a second disc-shaped ceramic material compact having a thickness which is approximately one-half of the completed ceramic layer thickness. A cooling gas channel is included on the surface of the second disc-shaped ceramic material compact within an area overlying the electrode. The method also includes placing the second ceramic material compact on the first ceramic material compact to form a laminate followed by firing the entire laminate to complete the ceramic layer. Also, the completed ceramic layer is bonded onto a metal base plate by means of an adhesive layer.

DETAILED DESCRIPTION

The present invention provides an electrostatic chuck and a method for manufacturing the same. Several exemplary embodiments of the present invention will now be described in detail with reference to the accompanying drawings. The electrostatic chuck of the present invention can be used in conjunction with a dry etching apparatus. A general configuration of the dry etching apparatus has been previously discussed with respect to FIG. 4. Accordingly, reference should be made to the discussion of FIG. 4 for the description of the general configuration of the dry etching apparatus. The electrostatic chuck of the present invention is described in detail below.

Figure 1:
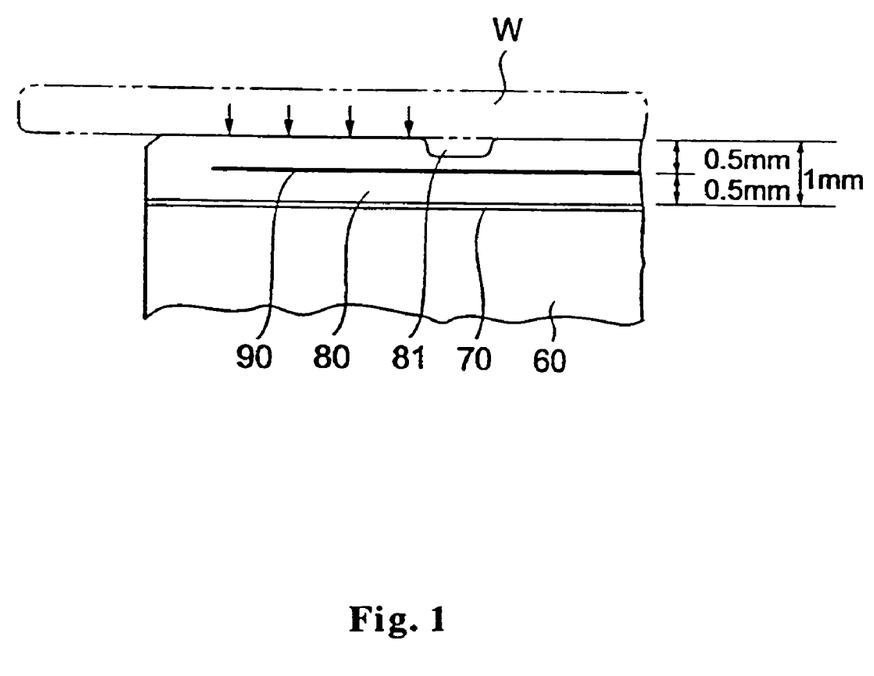
FIG. 1 is a cross-sectional view of an embodiment of an electrostatic chuck according to the present invention.

FIG. 1 is an illustration showing a cross-sectional view of an electrostatic chuck, in accordance with one embodiment of the present invention. As shown in FIG. 1, the electrostatic chuck includes a disc-shaped ceramic layer 80 having a predetermined thickness bonded onto a disc-shaped metal base plate 60 by means of an adhesive layer 70. A planar electrode 90 is disposed within the ceramic layer 80 and is oriented to be parallel to a surface of the ceramic layer 80. In one exemplary embodiment, the planar electrode 90 is made of tungsten. The planar electrode 90 is disposed within the ceramic layer 80 at a depth of one-half of the thickness thereof. In other words, the planar electrode 90 is positioned in the middle of the ceramic layer 80 relative to a thickness direction.

Figure 2:
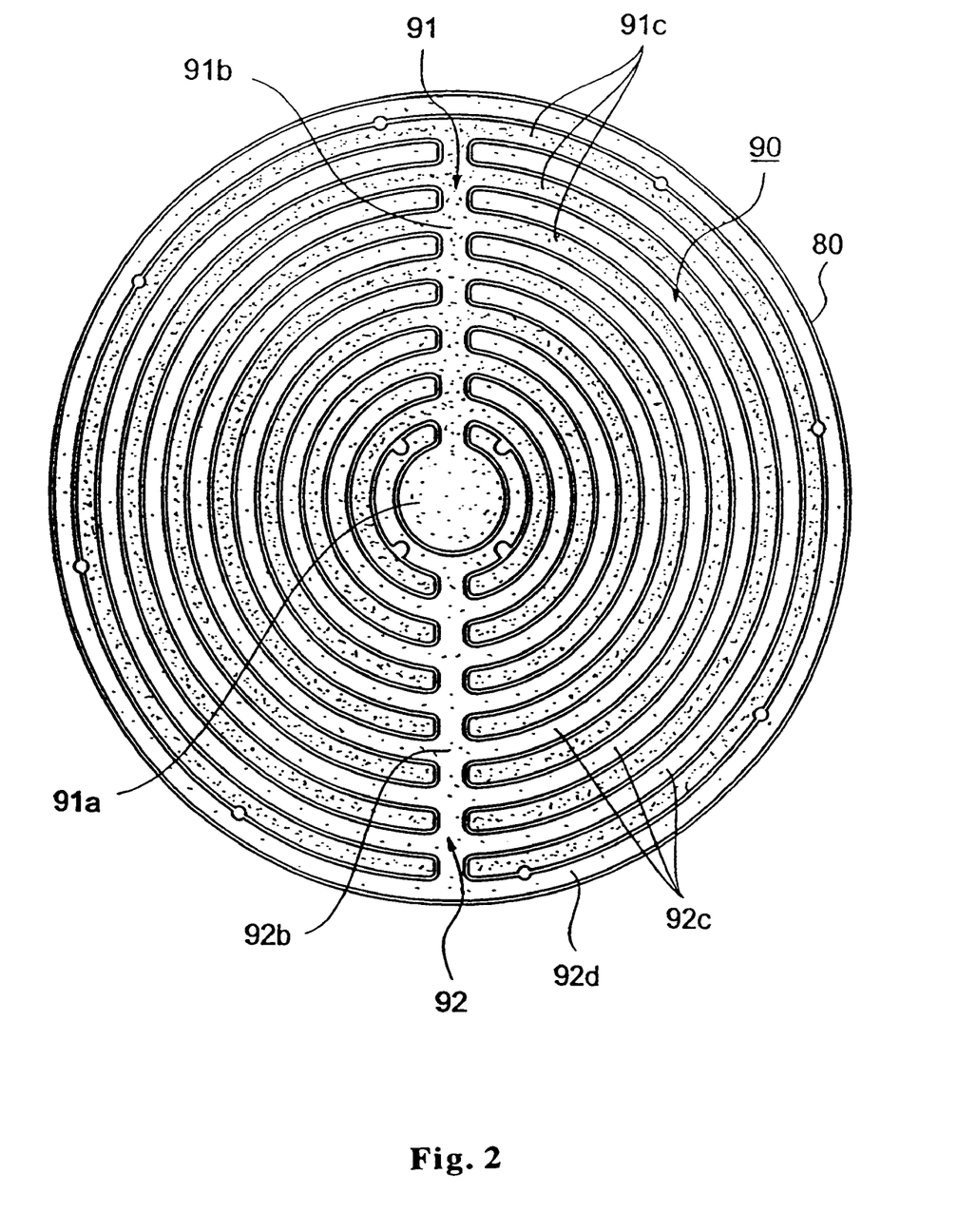
FIG. 2 is a top plan view of an electrode of the electrostatic chuck illustrated in FIG. 1.

FIG. 2 is an illustration showing a top plan view of the planar electrode 90, in accordance with one embodiment of the present invention. The planar electrode 90 includes a first electrode 91 and a second electrode 92. Therefore, the electrostatic chuck of this embodiment is of a bipolar type. The first electrode 91 includes a disc portion 91a defined about the center of the ceramic layer 80 and a linear portion 91b extending linearly from a part of the disc portion 91a toward an outer peripheral edge of the ceramic layer 80. The first electrode 91 further includes a number of "C-shaped" ring portions 91c positioned at predetermined intervals so as to surround the disc portion 91a. More particularly, each of the number of "C-shaped ring" portions 91c has a different diameter relative to a center of the disc portion 91a and extends in a "C" shape on both sides of the linear portion 91b. The second electrode 92 includes a linear portion 92b positioned opposite to the linear portion 91b of the first electrode 91 and beyond the disc portion 91a of the first electrode 91. Also, the second electrode 92 includes a number of "C-shaped" ring portions 92c positioned at predetermined intervals and arranged complementary to the number of "C-shaped" ring portions 91c of the first electrode 91. More particularly, each of the number of "C-shaped" ring portions 92c has a different diameter relative to the center of the disc portion 91a and extends in a "C" shape on both sides of the linear portion 92b to be engaged with the number of "C-shaped" ring portions 91c of the first electrode 91. Furthermore, the electrode 91 includes a circular ring portion 92d connected to an outer edge of the linear portion 92b, such that the circular ring portion 92d forms the outermost peripheral portion of the planar electrode 90.

With respect to FIG. 1, a cooling gas channel 81 is formed on a top surface of the ceramic layer 80. The cooling gas channel 81 is provided in a ring shape along the outer peripheral edge of the ceramic layer 80, as shown in a top plan view in FIG. 3. In addition, the cooling gas channel 81 is formed within the outer peripheral edge of the planar electrode 90 and over the planar electrode 90, as shown in FIG. 1. Accordingly, the planar electrode 90 passes under the bottom of the cooling gas channel 81 and extends beyond the cooling gas channel 81 near to the outer periphery of the ceramic layer 80.

Figure 3:
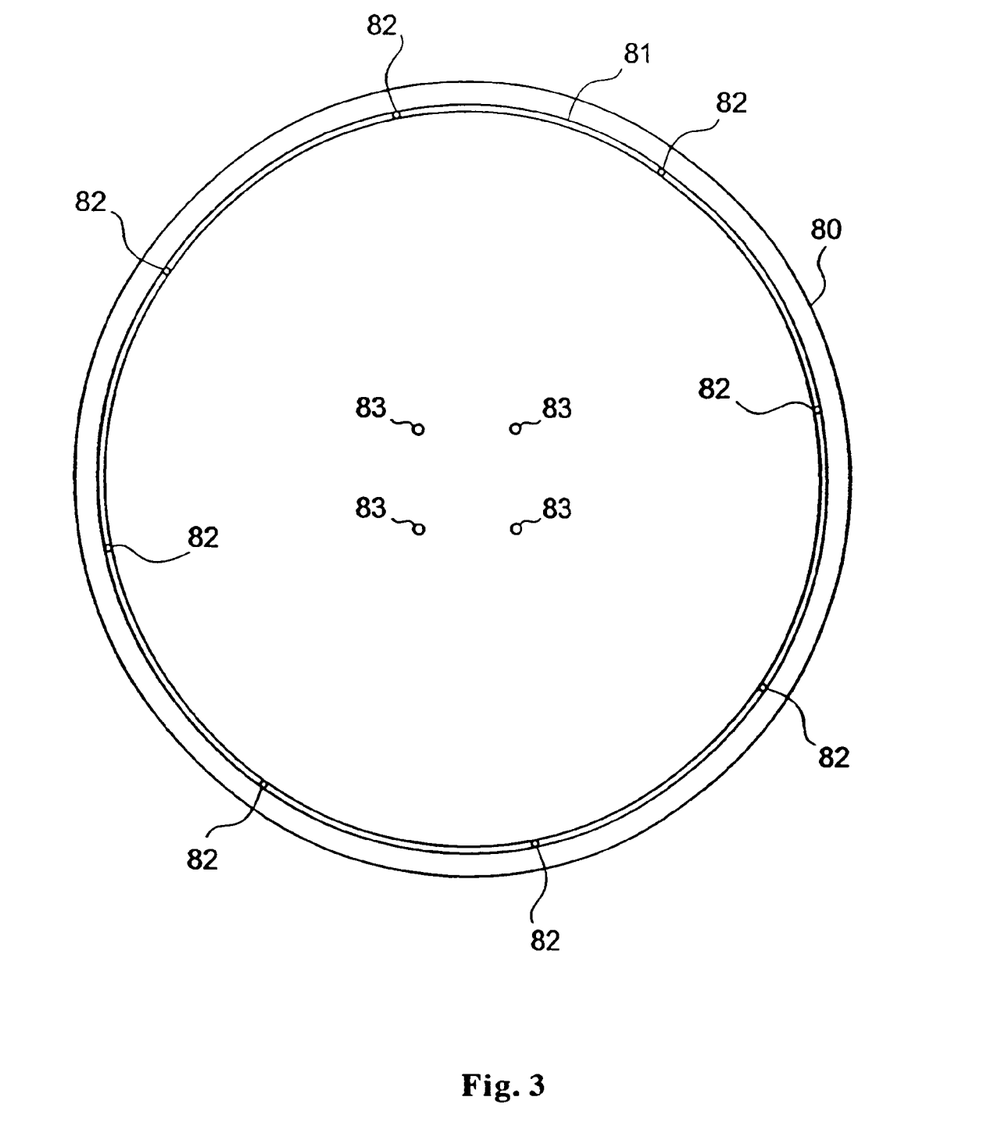
FIG. 3 is a top plan view of a ceramic layer of the electrostatic chuck illustrated in FIG. 1.

Gas feed orifices 82 are provided at a bottom of the cooling gas channel 81 in a number of locations along the circumferential direction of the cooling gas channel 81, as shown in FIG. 3. Additionally, a number of gas feed orifices 83 are provided at a number of locations on a top surface of the ceramic layer 80. The number of gas feed orifices 83 are positioned toward a center of the ceramic layer 80 and at a common radius from the center of the ceramic layer 80. The gas feed orifices 82 and 83 extend through the ceramic layer 80, the adhesive layer 70, and the base plate 60. A cooling gas such as helium gas, for example, is fed from the bottom of the base plate 60. In accordance with the foregoing, the helium gas fed through the gas feed orifices 82 and 83 is dispensed from the bottom of the cooling gas channel 81 and from the central locations on the top surface of the ceramic layer 80. The helium gas diffuses from both the outer peripheral portion and the central portion of the ceramic layer 80 over the entire interface between the ceramic layer 80 and the semiconductor wafer W, as shown in FIG. 1, so as to cool the semiconductor wafer W.

In one embodiment, the electrode 90 of the electrostatic chuck includes a high-melting point metal having a coefficient of linear thermal expansion that is different from a coefficient of linear thermal expansion of the ceramic layer 80. However, since the electrode 90 is disposed in the middle of the ceramic layer 80, relative to the thickness direction of the ceramic layer 80, differential thermal expansion between the electrode 90 and the ceramic layer 80 will not cause the top surface of the ceramic layer 80 to warp. Furthermore, even if the ceramic layer 80 is formed by firing, placement of the electrode 90 at the middle of the ceramic layer 80 will allow the top surface of the ceramic layer 80 to remain flat. In addition, improvement of the flatness of the ceramic layer 80 leads to improvement of semiconductor wafer W etching characteristics (for example, uniformity) and an increase in the attraction of the semiconductor wafer W to the electrostatic chuck.

The cooling gas channel 81 is formed near an outer peripheral edge of the electrode 90 and over the electrode 90. Thus, the electrode 90 extends beyond the cooling gas channel 81 and into the gas-sealed region extending from the cooling gas channel 81 to the outer periphery of the ceramic layer 80. Therefore, with respect to FIG. 1, the electrode 90 is positioned to apply electrostatic attraction over the gas-sealed region as indicated by arrows. Consequently, the electrostatic attraction over the gas-sealed region prevents gas leakage from the gas-sealed region. Prevention of gas leakage leads to improved cooling of the semiconductor wafer W, thus improving the etching characteristics such as center-to-edge uniformity as measured across the semiconductor wafer W.

Positioning of the electrode 90 in the middle of the ceramic layer 80 relative to the thickness direction of the ceramic layer 80, allows the cooling gas channel 81 to be formed sufficiently deep, even in locations overlying the electrode 90. Forming the cooling gas channel 81 in a sufficiently deep manner allows the helium gas to smoothly flow, thus allowing the semiconductor wafer W to be cooled more favorably. In addition, forming the cooling gas channel 81 over the electrode 90 allows the gas-sealed region between the cooling gas channel 81 and the periphery of the ceramic layer 80 to be of sufficient distance so as to more reliably prevent gas leakage. Also, forming the cooling gas channel 81 over the electrode 90 avoids a need to decrease an area of the electrode 90 to accommodate a position of the cooling gas channel 81. Additionally, even if the electrode 90 is located at a deep position in the ceramic layer 80, a sufficient electrostatic attraction can be secured because electrostatic attraction is also applied to the gas-sealed region between the cooling gas channel 81 and the periphery of the ceramic layer 80 as described above.

Furthermore, the first electrode 91 and the second electrode 92 each occupy an identical area and are each uniformly distributed over the ceramic layer 80. Therefore, the first and second electrodes, 91 and 92, allow uniform electrostatic attraction to be achieved over the entire ceramic layer 80. Still further, the ratio of the area of the first electrode 91 to the area of the ceramic layer 80 can be increased, thus allowing the electrostatic attraction to be enhanced. Additionally, with the electrostatic chuck of the present invention, detaching or "dechucking" of a wafer after processing is improved in comparison with a conventional electrostatic chuck having a conventional doughnut or threading pattern, whereby the conventional doughnut or threading pattern causes an uneven ratio of an area of the first electrode to that of the second electrode. The uneven ratio of the area of the first electrode to the second electrode in the conventional electrostatic chuck can lead to a maldistribution of electric charges and cause poor dechucking performance.

In one exemplary embodiment, the base plate 60, with respect to FIG. 1, is preferably formed by using an aluminum 6061 material. A high radio frequency (RF) power is fed to the base plate 60 in order to generate a plasma in the chamber 11 of the etching apparatus as shown in FIG. 4. The high RF power to be applied may have a frequency in the range extending from 1 MHz to 40 MHz and a power in the range extending from 15 W to 3000 W.

In one exemplary embodiment, the adhesive layer 70 is defined by a suitable, flexible, preferably organic, adhesive. With the ceramic layer 80 bonded to the base plate 60 by means of the flexible organic adhesive layer 70, the ceramic layer 80 is prevented from cracking as a result of differential stress induced by differential thermal expansion.

In one exemplary embodiment, the ceramic layer 80 is formed by adding conductive additive to aluminum oxide, for example, aluminum nitride or magnesium oxide. In this embodiment, the ceramic layer 80 is formed by using aluminum oxide ($Al_2O_3$) as a predominant component and titanium oxide (TiO$_2$) and glass firing auxiliary material as additives. The additive TiO$_2$ is added to cause the ceramic layer 80 to be slightly conductive, thus allowing electric charges for generating electrostatic attraction rise from the electrode 90 up to the surface of the ceramic layer 80. A resistivity of the ceramic layer 80 is selected to be within a range extending from $10^{11}$ Ω/cm to $10^{12}$ Ω/cm, and more preferably within a range extending from $1.0 \times 10^{11}$ Ω/cm to $2.0 \times 10^{11}$ Ω/cm.

In one exemplary embodiment, a diameter of the ceramic layer 80 is slightly smaller than that of the semiconductor wafer W. Additionally, a thickness of the ceramic layer 80 is approximately 1 mm taking into consideration dielectric breakdown and an energy loss of the high-frequency power. Also in this exemplary embodiment, a surface roughness of the ceramic layer 80 is Ra=0.8 μm, and a flatness of the ceramic layer 80 is 5 μm or lower. The outer peripheral edge on the top surface of the ceramic layer 80 is chamfered by 0.2 mm to 0.25 mm.

In one exemplary embodiment, the cooling gas channel 81 is formed so as to extend 5 mm within the outer peripheral edge of the ceramic layer 80 and to be 1 mm wide and 0.25 mm deep. On the bottom surface of the cooling gas channel 81, eight gas feed orifices 82 are located at 45° intervals in a circumferential direction formed by the cooling gas channel 81. On the top surface and toward the center of the ceramic layer 80, four gas feed orifices 83 are located at 90° intervals on the circumference of 0.35 mm diameter. Each gas feed orifice 82 is 0.32 mm in diameter, and each gas feed orifice 83 is 0.35 mm in diameter. The gas feed orifices 83 on the top surface and toward the center of the ceramic layer 80 also serve as insertion orifices for pins for lifting the semiconductor wafer W, and are therefore formed to be slightly larger than the gas feed orifices 82 on the bottom surface of the cooling gas channel 81.

In one exemplary embodiment, the electrode 90 (consisting of the first and second electrodes 91 and 92) is made of tungsten having a thickness of 10 μm to 20 μm. The electrode 90 is approximately 1 mm smaller in radius than the ceramic layer 80 and is laid in a position spaced 0.5 mm from each of the top surface and bottom surface of the ceramic layer 80, wherein the ceramic layer 80 has a thickness of 1 mm. In other words, the electrode 90 is positioned in the middle of the ceramic layer 80, relative to the thickness direction of the ceramic layer 80.

In one exemplary embodiment, the disc portion 91*a* of the first electrode 91, as shown in FIG. 2, is approximately 30 mm in diameter. The linear portion 91*b* of the first electrode 91 and the linear portion 92*b* of the second electrode 92 are each approximately 6.0 mm wide. There are seven C-shaped ring portions 91*c* of the first electrode 91 having consecutively increasing diameters. There are seven C-shaped ring portions 92*c* of the second electrode 92 having consecutively increasing diameters. A single circular ring portion 92*d* of the second electrode 92 is provided on the outermost periphery of the electrode 90. The C-shaped ring portions 91*c* of the first electrode 91, the C-shaped ring portions 92*c* of the second electrode 92, and the circular ring portion 92*d* have slightly different widths, with an average width of the ring portions 91*c*, 92*c*, and 92*d* being approximately 5.0 mm. Each portion of the first electrode 91 is spaced 1.0 mm away from adjacent portions of the second electrode 92. The total area of the first electrode 91 is 128.3 cm$^2$, and the total area of the second electrode 92 is nearly the same size at 128.4 cm$^2$.

In one embodiment, a manufacturing method is provided. The manufacturing method includes preparing a first disc-shaped ceramic material compact having one-half of a thickness of a ceramic layer. An electrode is formed on a surface of the first ceramic material compact in a screen printing process. The method also includes preparing a second disc-shaped ceramic material compact having one-half of the thickness of the ceramic layer and including a cooling gas channel on its surface at a location overlying an area to be occupied by the electrode. The second ceramic material compact is placed on the first ceramic material compact for contact bonding. In following, the entire material is fired to complete the ceramic layer. In the presently described manufacturing method, no warpage occurs due to the location of the electrode in the middle of the ceramic layer, relative to the thickness direction of the ceramic layer. Subsequently, the ceramic layer is bonded to an aluminum base plate by means of an adhesive layer.

While the present invention has been described in terms of an exemplary electrostatic chuck to be used in a dry etching apparatus, it should be appreciated that the electrostatic chuck of the present invention may be also be implemented within a CVD apparatus or the like, for example a target. In addition, the electrostatic chuck of the present invention can be adapted for use in electrostatically attracting materials other than semiconductor wafers, for example, ceramic substrates. In accordance with the disclosure above, the present invention provides an electrostatic chuck, and a method for manufacturing the same, that prevents warpage of a ceramic layer included therein. Furthermore, the electrostatic chuck of the present invention prevents a cooling gas leakage from occurring at a periphery thereof and increases an electrostatic attraction.

The invention claimed is:

1. An electrostatic chuck, comprising:
    a metal base plate;
    a ceramic disc having a predetermined thickness adhesively bonded to said metal base plate;
    a planar electrode positioned in the middle of said ceramic disc relative to a thickness direction of said ceramic disc; and
    a cooling gas channel formed on a top surface of said ceramic disc over said electrode and within an outer peripheral edge of said electrode, the cooling gas channel defining an inner boundary of a gas-sealed region at a periphery of the ceramic disc, wherein said planar electrode extends beyond said cooling gas channel.

2. An electrostatic chuck according to claim 1, wherein said cooling gas channel comprises a ring shape along an outer peripheral edge of said ceramic disc, said chuck further comprising gas feed orifices located in a plurality of positions at a bottom portion of said gas cooling channel and gas feed orifices located in a plurality of positions on a circumference on a surface of said ceramic disc in the center side of the chuck.

3. An electrostatic chuck according to claim 1, wherein said planar electrode includes a first electrode and a second electrode,
    said first electrode including,
    a disc portion arranged in the center of said ceramic layer, and
    a first extending portion extending from a part of the disc portion toward the outer peripheral edge of said ceramic layer,
    said second electrode including,
    a second extending portion arranged opposite to said first extending portion relative to said disc portion of said first electrode, and a circular ring portion connected to an outer edge of said second extending portion so as to form the outer peripheral edge of said second electrode.

4. An electrostatic chuck according to claim 3, wherein said first electrode further includes a plurality of first C-shaped ring portions at predetermined intervals so as to have different diameters, the first C-shaped ring portions extending in C shapes from both sides of said first extending portion around said disc portion.

5. An electrostatic chuck according to claim 4, wherein said second electrode further includes a plurality of second C-shaped ring portions at predetermined intervals so as to have different diameters, the second C-shaped ring portions extending in C shapes from both sides of said second extending portion and being engaged with said plurality of first C-shaped ring portions of said first electrode.

6. A method for manufacturing an electrostatic chuck, comprising:
preparing a first disc-shaped ceramic material compact having a half of a thickness of a completed ceramic layer;
forming an electrode on a surface of said first ceramic material compact;
preparing a second disc-shaped ceramic material compact having a half of a thickness of the completed ceramic layer and having a cooling gas channel on its surface in a location overlying said electrode, the cooling gas channel defining an inner boundary of a gas-sealed region at a periphery of the second disc-shaped ceramic material compact;
placing said second ceramic material compact on said first ceramic material compact so as to form a laminate, wherein said planar electrode extends beyond said cooling gas channel in the laminate;
firing the entire laminate to form the completed ceramic layer; and
bonding the completed ceramic layer to a metal base plate by means of an adhesive layer.

7. The method of claim 6, wherein said adhesive layer is flexible.

8. An electrostatic chuck, comprising:
a disc-shaped ceramic layer having a top surface configured to support a wafer;
a first planar electrode positioned at a center of the ceramic layer relative to a thickness direction of the ceramic layer, the first planar electrode being oriented in a substantially parallel relationship with the top surface of the ceramic layer, the first planar electrode including,
a circular portion disposed in the center of the ceramic layer,
a linear portion extending from the circular portion toward an outer peripheral edge of the ceramic layer,
a plurality of C-shaped portions extending from the linear portion at respectively increasing radial distances from a center of the circular portion, each of the plurality of C-shaped portions maintaining a uniform distance from the center of the circular portion; and
a second planar electrode defined to be co-planar with the first planar electrode, the second planar electrode including portions defined between the linear portion and the C-shaped portions of the first planar electrode, the second planar electrode including an outer ring portion defined to encompass the linear portion and the C-shaped portions of the first planar electrode,
wherein the first and second planar electrodes do not physically contact each other.

9. An electrostatic chuck as recited in claim 8, wherein the outer ring portion of the second planar electrode extends radially to within approximately one millimeter of an outer peripheral edge of the disc-shaped ceramic layer.

10. An electrostatic chuck as recited in claim 8, wherein each of the first and second planar electrodes are defined by tungsten having a thickness within a range extending from about 10 micrometers to about 20 micrometers.

11. An electrostatic chuck as recited in claim 8, wherein the circular portion of the first planar electrode is defined by a diameter of approximately 30 millimeters, and the plurality of C-shaped portions of the first planar electrode, the linear portion of the first planar electrode, and the portions of the second electrode having an average width of approximately 5 millimeters.

12. An electrostatic chuck as recited in claim 11, wherein a spacing of about one millimeters is maintained between the respective portions of the first and second planar electrodes.

13. An electrostatic chuck as recited in claim 8, wherein a total area of the first planar electrode is approximately equal to a total area of the second planar electrode.

* * * * *